United States Patent [19]
Kanai

[11] Patent Number: 5,839,637
[45] Date of Patent: Nov. 24, 1998

[54] ELECTRONIC COMPONENTS FEEDER

[75] Inventor: Takeshi Kanai, Gunma-ken, Japan

[73] Assignee: Sanyo Electric Co., Ltd., Osaka-Fu, Japan

[21] Appl. No.: 882,167

[22] Filed: Jun. 25, 1997

[30] Foreign Application Priority Data

Jun. 28, 1996 [JP] Japan ................................. 8-188512

[51] Int. Cl.⁶ ........................... B65H 20/00; B65H 57/06; B65G 65/04
[52] U.S. Cl. ........................ 226/128; 226/139; 226/151; 242/615.3; 414/416
[58] Field of Search .................................. 226/151, 167, 226/59, 62, 139, 157, 128; 242/615.3; 414/416

[56] References Cited

U.S. PATENT DOCUMENTS

| 4,887,778 | 12/1989 | Soth et al. ......................... 226/139 X |
| 4,943,342 | 7/1990 | Golemon ............................. 226/62 X |
| 4,952,113 | 8/1990 | Fujioka .............................. 226/151 X |
| 5,531,859 | 7/1996 | Lee et al. ........................... 226/139 X |
| 5,725,140 | 3/1998 | Weber et al. ........................ 226/62 X |
| 5,762,754 | 6/1998 | Kondo et al. ....................... 414/416 X |

FOREIGN PATENT DOCUMENTS 0 318 381  5/1989  European Pat. Off. .
0 345 061  12/1989  European Pat. Off. .
0 460 834  12/1991  European Pat. Off. .

*Primary Examiner*—Michael Mansen
*Attorney, Agent, or Firm*—Darby & Darby

[57] ABSTRACT

A carrier tape for carrying electronic components thereon forward to a sucking position is formed therein with a plurality of recesses for accommodating the electronic components, respectively, and advanced intermittently with the electronic components contained in the recesses. A suppressor is arranged at a location backward of the sucking position for preventing the electronic components from jumping out of the recesses. A shutter is arranged for sliding contact with the carrier tape such that the shutter is capable of being moved forward and backward along length of the carrier tape to open and close each of the recesses in the sucking position. The shutter has a forward end portion larger in width than a width of the each of the recesses and is formed by a plate spring extending obliquely toward the carrier tape for suppressing the carrier tape. The suppressor has a shutter-receiving portion extending toward the sucking position for receiving the shutter when the shutter is moved backward to open the each of the recesses in the sucking position. Alternatively, the shutter comprises a sliding contact portion for sliding contact with an upper surface of the carrier tape, a holding portion for holding the sliding contact portion, and a spring interposed between the sliding contact portion and the holding portion to urge the sliding contact portion against the carrier tape.

11 Claims, 2 Drawing Sheets

ELECTRONIC COMPONENTS FEEDER

BACKGROUND OF THE INVENTION

1. Field of the Invention

This invention relates to an electronic components feeder which employs a carrier tape, and more particularly to an electronic components feeder of this kind which opens and closes a shutter thereof at a sucking position where an electronic component is to be picked up by sucking.

2. Prior Art

Conventionally, an electronic components feeder of this kind has been proposed by Japanese Laid-Open Patent Publications (Kokai) Nos. 6-85491 and 7-30282, which intermittently feeds chips (electronic components) in respective chip-holding recesses formed on a carrier tape to a sucking position, and then opens a shutter provided at the sucking position for covering each chip-holding recess in position, to thereby permit each chip to be sucked by a sucking nozzle. At the sucking position, after the shutter opens upon stoppage of the carrier tape, the sucking nozzle is lowered to pick up the chip. Then, when the sucking nozzle is lifted with the chip sucked at its end, the shutter is closed again, followed by the carrier tape being advanced, with the shutter in a closed position.

In the proposed electronic components feeder, a suppressor is arranged over the carrier tape such that it extends toward the sucking position to thereby prevent chips from jumping out of the carrier tape after a cover tape sealing the chip-holding recesses is removed from the carrier tape. Further, the suppressor has a sucking position-side end thereof located backward of the sucking position by a distance equal to one stroke of the shutter so as to provide room for the backward movement of the shutter. To cover space between the suppressor and the shutter at the sucking position, a thin plate is arranged between the carrier tape and the suppressor such that it extends to a location immediately close to the sucking position. That is, the shutter is caused to move or slide forward and backward on the thin plate.

According to the conventional electronic components feeder described above, the shutter slides on the thin plate, so that a gap as wide as thickness of the thin plate is necessarily produced between a bottom surface of the shutter in the closed position and a top portion of each chip-holding recess of the carrier tape advanced to the sucking position. This means that a considerable amount of space is produced between the bottom surface of the shutter and the chip in the chip-holding recess in the sucking position. As a result, the chip is jolted or shaken within the chip-holding recess by inertia or the like the instant the carrier tape is brought to a halt. If the shutter is opened before the shaking motion of the chip ceases, the chip is likely to stand on its side, move to one side, or even jump out of the chip-holding recess. Therefore, there is a fear of the chip being sucked in an inappropriate attitude, or the sucking nozzle failing to pick up the chip. Needless to say, this inconvenience can be avoided by opening the shutter after the vibration of the chip stops. In this case, however, a time period required for picking up each chip (i.e. tact time) becomes longer.

SUMMARY OF THE INVENTION

It is the object of the invention to provide an electronic components feeder which permits electronic components to be sucked in an appropriate manner in reduced tact time.

To attain the above object, according to a first aspect of the invention, there is provided an electronic components feeder including a carrier tape for carrying electronic components thereon forward to a sucking position, the carrier tape being formed therein with a plurality of recesses for accommodating the electronic components, respectively, and advanced intermittently with the electronic components contained in the recesses, a suppressor arranged at a location backward of the sucking position for preventing the electronic components from jumping out of the recesses, and a shutter arranged for sliding contact with the carrier tape such that the shutter is capable of being moved forward and backward along length of the carrier tape to open and close each of the recesses in the sucking position.

The electronic components feeder according to the first aspect of the invention is characterized in that the shutter has a forward end portion larger in width than a width of the each of the recesses and is formed by a plate spring extending obliquely toward the carrier tape for suppressing the carrier tape, and the suppressor has a shutter-receiving portion extending toward the sucking position for receiving the shutter when the shutter is moved backward to open the each of the recesses in the sucking position.

According to the first aspect of the invention, the shutter is formed of the plate spring and its forward end portion is larger in width than a width of each of the recesses. Therefore, the forward end portion is constantly in intimate sliding contact with an upper surface of the carrier tape in a manner suppressing the same except when the shutter is in the open position, without directly sliding on the electronic component in each of the recesses. This construction makes it possible to minimize a gap or space between a bottom surface of the shutter and a top of the electronic component. As a result, the vibration or shaking of the electronic component which occurs at the instant the carrier tape comes to a halt can be reduced to a small amplitude, whereby the electronic component can be prevented from jumping out of the recess or standing on its side within the recess after the shutter is opened. Further, the resilient properties of the shutter itself prevents the shutter from being readily lifted off the carrier tape when the shutter hits an end of the shutter-receiving portion as it is moved backward or in an opening direction. That is, the shutter remains in contact with the carrier tape until the shutter is stretched linearly or horizontally after hitting the end of the shutter-receiving portion, which makes it possible to position the end of the shutter-receiving portion at a location closer to the sucking position. In other words, it is possible to extend the end of the suppressor toward the sucking position without losing sufficient room for the backward movement of the shutter, and hence dispense with a thin plate which the prior art employs.

Preferably, the shutter-receiving portion is formed in a manner such that the shutter-receiving portion has a thickness progressively decreased toward the sucking position.

According to this preferred embodiment, when the shutter is moved backward, the end of the shutter-receiving portion is hit by a lower portion of the shutter, i.e. the forward end portion of the shutter extending obliquely toward the carrier tape. This makes it possible to position the end of the shutter-receiving portion of the suppressor at a location closer to the sucking position. Therefore, it is possible to construct the shutter such that it can be moved onto the shutter-receiving portion, and at the same time extend the end of the suppressor to a location immediately close to the sucking position.

Preferably, the shutter has a forward end thereof slightly bent upward.

According to this preferred embodiment, the shutter extending obliquely toward the carrier tape is prevented from being caught at its forward end by the carrier tape when the shutter is moved forward to close the recess in the sucking position, thereby enabling the shutter to smoothly carry out a closing operation while suppressing the carrier tape.

To attain the above object, according to a second aspect of the invention, there is provided an electronic components feeder including a carrier tape for carrying electronic components thereon forward to a sucking position, the carrier tape being formed therein with a plurality of recesses for accommodating the electronic components, respectively, and advanced intermittently with the electronic components contained in the recesses, a suppressor arranged at a location backward of the sucking position for preventing the electronic components from jumping out of the recesses, and a shutter arranged for sliding contact with the carrier tape such that the shutter is capable of being moved forward and backward along the length of the carrier tape to open and close each of the recesses in the sucking position.

The electronic components feeder according to the second aspect of the invention is characterized in that the shutter comprises a sliding contact portion for sliding contact with an upper surface of the carrier tape, a holding portion for holding the sliding contact portion, and a spring interposed between the sliding contact portion and the holding portion to urge the sliding contact portion against the carrier tape, and the suppressor has a shutter-receiving portion extending toward the sucking position for receiving the shutter when the shutter is moved backward to open the each of the recesses in the sucking position.

According to the second aspect of the invention, the spring of the shutter urges the sliding contact portion thereof against the carrier tape. Therefore, it is possible to hold the sliding contact portion in intimate contact with the carrier tape when the shutter is in a closed position irrespective of variations in the manufacturing accuracy or mounting accuracy of the shutter. Thus, the shutter is prevented from being readily lifted off the carrier tape, which makes it possible to minimize a gap or space between the bottom surface of the shutter in the closed position and the upper surface of the electronic component in the recess in the sucking position.

Preferably, the sliding contact portion is larger in width than a width of the each of the recesses.

More preferably, the shutter-receiving portion is formed in a manner such that the shutter-receiving portion has a thickness progressively decreased toward the sucking position.

More preferably, the sliding contact portion of the shutter has a backward end thereof slightly bent upward.

According to this preferred embodiment, when the sliding contact portion of the shutter slides backward to be received by the shutter-receiving portion, the backward movement of the shutter is not obstructed by the shutter-receiving portion, but permits the sliding contact portion to be moved smoothly onto the shutter-receiving portion.

The above and other objects, features, and advantages of the invention will become more apparent from the following detailed description taken in conjunction with the accompanying drawings.

DETAILED DESCRIPTION

The invention will now be described in detail with reference to the drawings showing embodiments thereof.

Figure 1A:
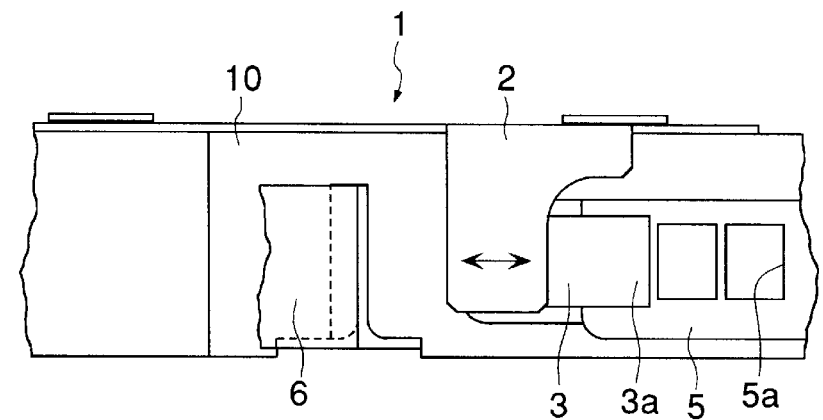
FIG. 1A is a plan view showing a shutter and component parts associated therewith, which are essential to an electronic components feeder according to a first embodiment of the invention, with the shutter in a closed position.
Figure 1B:
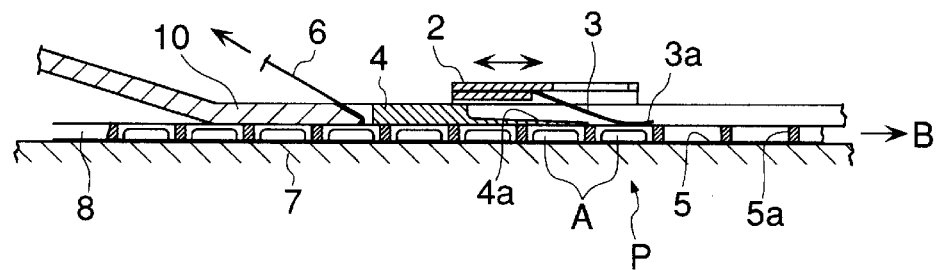
FIG. 1B is a cross-sectional view showing the shutter and component parts associated therewith shown in FIG. 1A.

Referring first to FIGS. 1A and 1B, there are shown essential parts of an electronic components feeder 1 according to a first embodiment of the invention. FIG. 1A shows them in plan view while FIG. 1B in cross-sectional view.

As shown in the figures, the electronic components feeder 1 has a tape-feeding passage 8 for feeding a carrier tape 5 which carries chips (electronic components) A thereon. The tape-feeding passage 8 is formed between a base plate 7 located on a lower side and a suppressor 4 located on an upper side. The carrier tape 5 is fed forward (i.e. in a direction indicated by arrow B in FIG. 1B) intermittently through the tape-feeding passage 8.

The carrier tape 5 has a plurality of chip-holding recesses 5a formed therein in line at equally spaced intervals, and a chip A is contained or held in each of the chip-holding recesses 5a. Further, the carrier tape 5 is provided with a cover tape 6 for covering the chip-holding recesses 5a to prevent the chips A from jumping out. The cover tape 6 is peeled off the carrier tape 5 by a claw 10 at an intermediate location of the tape-feeding passage 8, whereby thereafter the carrier tape 5 is advanced with the cover tape 6 removed therefrom, to a sucking position P where each chip A is to be sucked.

At the sucking position P, a shutter 3 is arranged which is formed of a stainless steel plate spring and driven by driving means, not shown, such that it is moved forward and backward in sliding contact with the carrier tape 5. The shutter 3 has its backward end portion held by a holder 2 caused to slide on the top of the suppressor 4, and extends from the holder 2 toward the carrier tape 5 in a manner obliquely bent forward such that the forward end portion 3a of the shutter 3 suppresses the carrier tape 5. The forward end portion 3a of the shutter 3 is formed such that it is wide enough to cover the chip-holding recess 5a, i.e. it has a width larger than that of the chip-holding recess 5a, and has a forward end thereof slightly bent upward. As the holder 2 is caused to slide back and forth on the suppressor 4 by the driving means in synchronism with intermittent feed of the carrier tape 5, the shutter 3 is caused to move back and forth such that its forward end portion 3a opens and closes the chip-holding recess 5a of the carrier tape 5 in the sucking position.

The suppressor 4 has a shutter-receiving portion 4a which extends toward the sucking position for receiving the shutter 3 when the shutter 3 is moved backward to open the chip-holding recess 5a. The shutter-receiving portion 4a is formed such that its thickness is progressively decreased in a direction of the sucking position P and it has a thickness of less than 0.1 mm at a forward end thereof. Further, the shutter-receiving portion 4a is made of a material which is harder than that of the shutter 3, so that it is not the shutter-receiving portion 4a but the shutter 3 that wears. The shutter 3 is easier to be replaced even if it wears out than the suppressor 4 integrally formed with the shutter-receiving portion 4a.

Figure 2A:
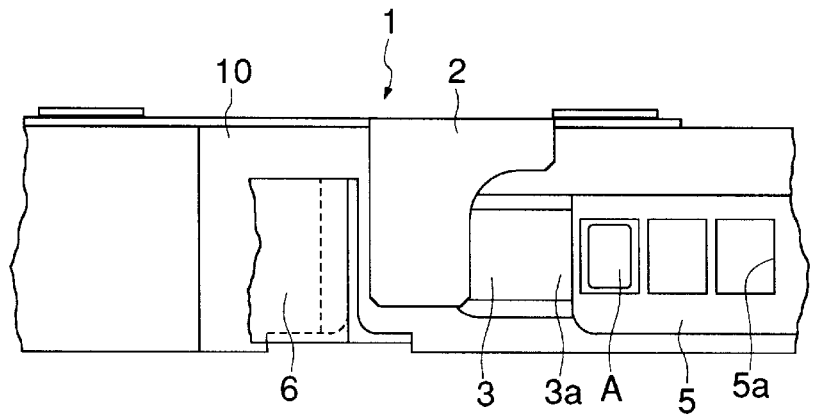
FIG. 2A is a plan view showing the shutter and component parts associated therewith, with the shutter in an open position.
Figure 2B:
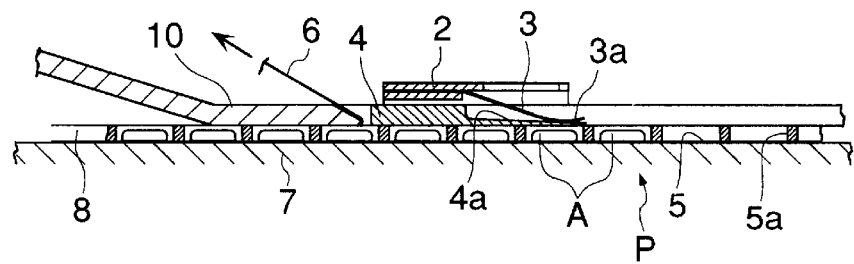
FIG. 2B is a cross-sectional view showing the shutter and component parts associated therewith shown in FIG. 2A.
Figure 3A:
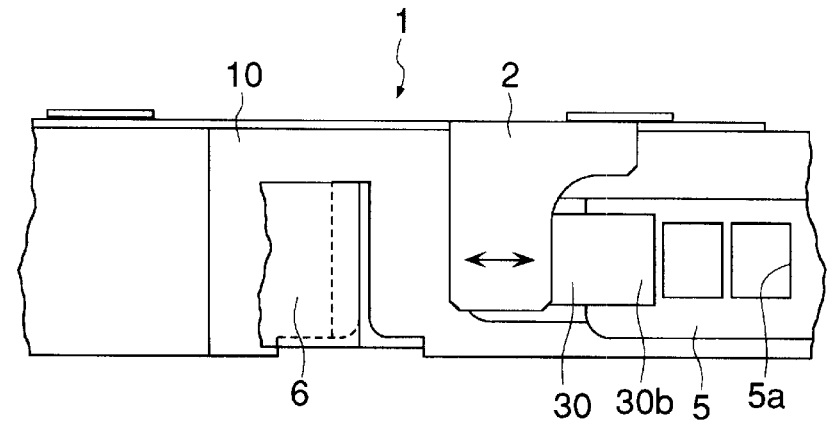
FIG. 3A is a plan view showing a shutter and component parts associated therewith, which are essential to an electronic components feeder according to a second embodiment of the invention, with the shutter in a closed position.
Figure 3B:
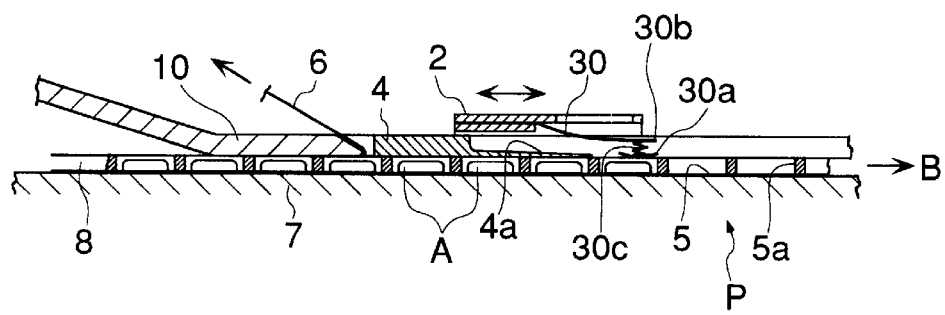
FIG. 3B is a cross-sectional view showing the shutter and component parts associated therewith shown in FIG. 3A.
Figure 4A:
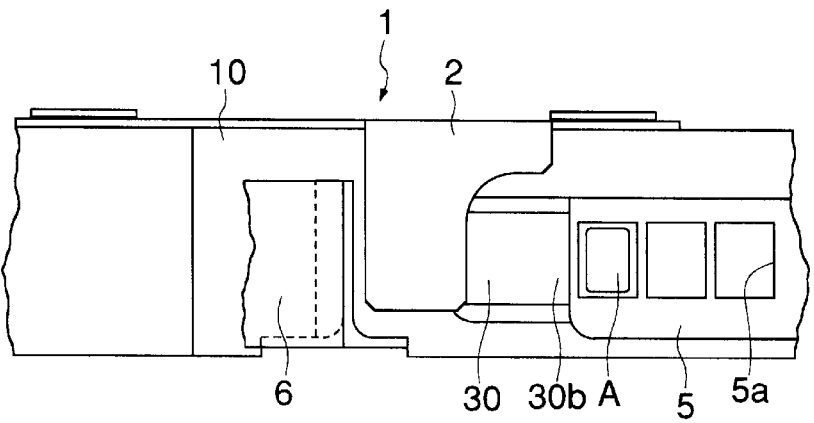
FIG. 4A is a plan view showing the shutter and component position associated therewith, with the shutter in an open state.
Figure 4B:
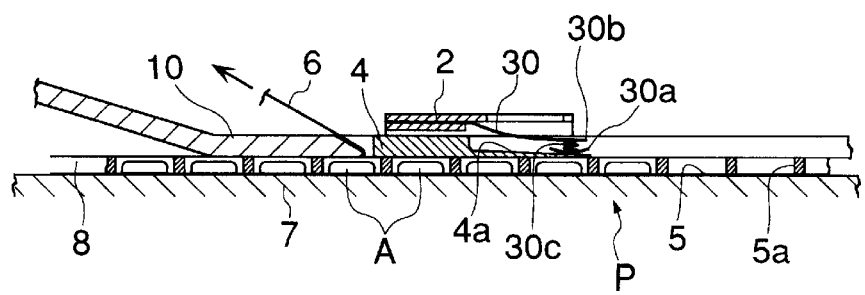
FIG. 4B is a cross-sectional view showing the shutter and component parts associated therewith shown in FIG. 4A.

Next, the opening/closing operations of the shutter 3 will be described with reference to FIGS. 1A, 1B showing the shutter 3 in a closed position and FIGS. 2A, 2B showing the same in an open position. First, as best shown in FIGS. 1A and 1B, as the holder 2 is moved forward, the shutter 3 is moved forward with its forward end portion 3a sliding on the upper surface of the carrier tape 5 (closing operation). The holder 2 stops moving forward when the whole forward end portion 3a of the shutter 3 is brought to the sucking position P, i.e. into its closed position. Then, the carrier tape 5 is fed or advanced, and stopped when a chip A to be sucked reaches the sucking position P. At this time point, a chip-holding recess 5a containing the chip A is in a state covered by the forward end portion 3a of the shutter 3.

When the carrier tape 5 comes to a halt, the chip A is jolted or shaken in the chip-holding recess 5a due to inertia. However, since the shutter 3 is urged against the carrier tape 5, the forward end portion 3a thereof is brought into intimate contact with the carrier tape 5 to cover the chip-holding recess 5a, so that only a very small gap or space is formed between the chip A and the forward end portion 3a. This makes it possible to minimize the vibration or shaking of the chip A upon stoppage of the carrier tape.

Then, as best shown in FIGS. 2A and 2B, as the holder 2 is moved backward, the shutter 3 is moved backward. The forward end portion 3a of the shutter 3 hits the forward end of the shutter-receiving portion 4a, and then is moved onto the shutter-receiving portion 4a. When the forward end portion 3a has been moved onto the shutter-receiving portion 4a, the chip-holding recess 5a is simultaneously opened. Here, it should be noted that the shutter-receiving portion 4a, which is formed such that its thickness is progressively reduced in the direction of the sucking position P, can be arranged in a manner extending to a location closer to the sucking position P than a shutter-receiving portion which is larger in thickness. Further, even if the shutter-receiving portion 4a had a thicker end, and hence not the forward end portion 3a of the shutter 3 but an upper portion thereof hit the forward end of the shutter-receiving portion 4a, resilient properties of the shutter 3 would prevent the forward end portion 3a from being readily lifted up, so that the forward end portion 3a would stay in contact with the carrier tape 5 until the obliquely extending portion of the shutter 3 is substantially brought to a linearly or horizontally extending position.

After the chip-holding recess 5a is opened, a sucking nozzle, not shown, is lowered to suck the chip A and then lifted. Then, the shutter 3 starts its closing operation, and when the closing operation is completed, an intermittent feed of the carrier tape 5 is carried out again.

As described above, according to the present embodiment, since the shutter 3 formed of the plate spring is arranged such that its forward end portion 3a is constantly urged against the carrier tape 5 except when the shutter 3 is in the open position, the forward end portion 3a of the shutter 3 is in intimate contact with the carrier tape 5 to cover the chip-holding recess 5a when the shutter 4 is in the closed position. As a result, there is produced only a very small gap or space between the forward end portion 3a and the chip A, whereby it is possible to reduce the shaking or vibration of the chip A contained in the chip-holding recess 5a, thereby permitting the chip A to be sucked in an appropriate manner. This also permits the shutter 3 to open the chip-holding recess 5a at faster timing, which leads to shortening of a time period required for picking up the chip A.

FIGS. 3A to 4B show a second embodiment of the invention. This embodiment is distinguished from the first embodiment in which the shutter 3 is formed of the plate spring as one piece member in that a shutter 30 is comprised of a sliding contact portion 30a for sliding contact with an upper surface of the carrier tape 5, a holding portion 30b for holding the sliding contact portion 30a, and a spring 30c interposed between the sliding contact portion 30a and the holding portion 30b with opposite ends of the spring 30c fixed to the portions 30a and 30b. The remainder of the second embodiment is constructed similarly to that of the first embodiment. The sliding contact portion 30a is larger in width than the chip-holding recess 5a, and not only a forward end thereof but also a backward end thereof is slightly bent upward. This enables the sliding contact portion 30a to smoothly slide backward onto the shutter-receiving portion of the suppressor.

According to this construction, it is possible to obtain the same effects as obtained by the first embodiment.

It is further understood by those skilled in the art that the foregoing is preferred embodiments of the invention, and that various changes and modifications may be made without departing from the spirit and scope thereof.

What is claimed is:

1. In an electronic components feeder including a carrier tape for carrying electronic components thereon forward to a sucking position, said carrier tape being formed therein with a plurality of recesses for accommodating said electronic components, respectively, and advanced intermittently with said electronic components contained in said recesses, a suppressor arranged at a location backward of said sucking position for preventing said electronic components from jumping out of said recesses, and a shutter arranged for sliding contact with said carrier tape such that said shutter is capable of being moved forward and backward along length of said carrier tape to open and close each of said recesses in said sucking position, the improvement wherein said shutter has a forward end portion larger in width than a width of said each of said recesses and is formed by a plate spring extending obliquely toward said carrier tape for suppressing said carrier tape, and wherein said suppressor has a shutter-receiving portion extending toward said sucking position for receiving said shutter when said shutter is moved backward to open said each of said recesses in said sucking position.

2. An electronic components feeder according to claim 1, wherein said shutter-receiving portion is formed in a manner such that said shutter-receiving portion has a thickness progressively decreased toward said sucking position.

3. An electronic components feeder according to claim 2, wherein said shutter has a forward end thereof slightly bent upward.

4. An electronic components feeder according to claim 1, wherein said shutter has a forward end thereof slightly bent upward.

5. In an electronic components feeder including a carrier tape for carrying electronic components thereon forward to a sucking position, said carrier tape being formed therein with a plurality of recesses for containing said electronic components, respectively, and advanced intermittently with said electronic components contained in said recesses, a suppressor arranged at a location backward of said sucking position for preventing said electronic components from jumping out of said recesses, and a shutter arranged for sliding contact with said carrier tape such that said shutter is capable of being moved forward and backward along length of said carrier tape to open and close each of said recesses in said sucking position, the improvement wherein said shutter comprises a sliding contact portion for sliding contact with an upper surface of said carrier tape, a holding portion for holding said sliding contact portion, and a spring interposed between said sliding contact portion and said holding portion to urge said sliding contact portion against said carrier tape, and wherein said suppressor has a shutter-receiving portion extending toward said sucking position for receiving said shutter when said shutter is moved backward to open said each of said recesses in said sucking position.

6. An electronic components feeder according to claim 5, wherein said sliding contact portion is larger in width than a width of said each of said recesses.

7. An electronic components feeder according to claim 6, wherein said shutter-receiving portion is formed in a manner such that said shutter-receiving portion has a thickness progressively decreased toward said sucking position.

8. An electronic components feeder according to claim 7, wherein said sliding contact portion of said shutter has a backward end thereof slightly bent upward.

9. An electronic components feeder according to claim 8, wherein said sliding contact portion of said shutter has a forward end thereof slightly bent upward.

10. An electronic components feeder according to claim 6, wherein said sliding contact portion of said shutter has a backward end thereof slightly bent upward.

11. An electronic components feeder according to claim 10, wherein said sliding contact portion of said shutter has a forward end thereof slightly bent upward.

\* \* \* \* \*